(12) United States Patent
Kobayashi

(10) Patent No.: US 12,428,225 B2
(45) Date of Patent: Sep. 30, 2025

(54) OVERHEAD TRANSPORT VEHICLE

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 407 days.

(21) Appl. No.: 18/035,372

(22) PCT Filed: Oct. 4, 2021

(86) PCT No.: PCT/JP2021/036619
§ 371 (c)(1),
(2) Date: May 4, 2023

(87) PCT Pub. No.: WO2022/102280
PCT Pub. Date: May 19, 2022

(65) Prior Publication Data
US 2024/0002148 A1    Jan. 4, 2024

(30) Foreign Application Priority Data

Nov. 10, 2020   (JP) ................................. 2020-187426

(51) Int. Cl.
*B65G 1/04* (2006.01)
*B61B 3/02* (2006.01)

(52) U.S. Cl.
CPC .............. *B65G 1/0457* (2013.01); *B61B 3/02* (2013.01); *B65G 2201/0297* (2013.01)

(58) Field of Classification Search
CPC .. B65G 1/0457; B65G 2201/0297; B61B 3/02
See application file for complete search history.

(56) References Cited

U.S. PATENT DOCUMENTS 3,601,228 A  *  8/1971  Nashif .................... F16F 7/108
                                                         188/268
5,178,357 A  *  1/1993  Platus .................... F16F 3/026
                                                         248/619

(Continued)

FOREIGN PATENT DOCUMENTS

| EP | 4029809 A1 | 7/2022 |
| WO | 2018/079146 A1 | 5/2018 |

OTHER PUBLICATIONS

Official Communication issued in corresponding European Patent Application No. 21891527.0, mailed on Nov. 18, 2024, 9 pages.

*Primary Examiner* — Saul Rodriguez
*Assistant Examiner* — Ashley K Romano
(74) *Attorney, Agent, or Firm* — Keating & Bennett, LLP

(57) ABSTRACT

An overhead transport vehicle includes a first support, a second support, and a link. The first support includes a first buffer and is connected to a belt on one side of a body in a width direction in plan view. The second support includes a second buffer and is connected to a belt at the other side of the body in the width direction. The link connects the first support and the second support, and reduces each of a first distance between the first support and a base and a second distance between the second support and the base in the vertical direction. The link includes at least one of a third buffer to allow relative movement of the base in a travel direction and a fourth buffer to allow relative movement thereof in the width direction with respect to the first and second supports.

8 Claims, 8 Drawing Sheets

(56) References Cited

U.S. PATENT DOCUMENTS

| | | | |
|---|---|---|---|
| 11,961,751 B2* | 4/2024 | Kobayashi | F16F 15/085 |
| 2006/0179729 A1* | 8/2006 | Li | F16F 15/06 |
| | | | 52/167.7 |
| 2012/0267505 A1* | 10/2012 | Guest | F16F 7/1028 |
| | | | 248/560 |
| 2017/0243775 A1* | 8/2017 | Kobayashi | H01L 21/67369 |
| 2019/0241406 A1 | 8/2019 | Kobayashi | |
| 2022/0157630 A1 | 5/2022 | Kobayashi | |

* cited by examiner

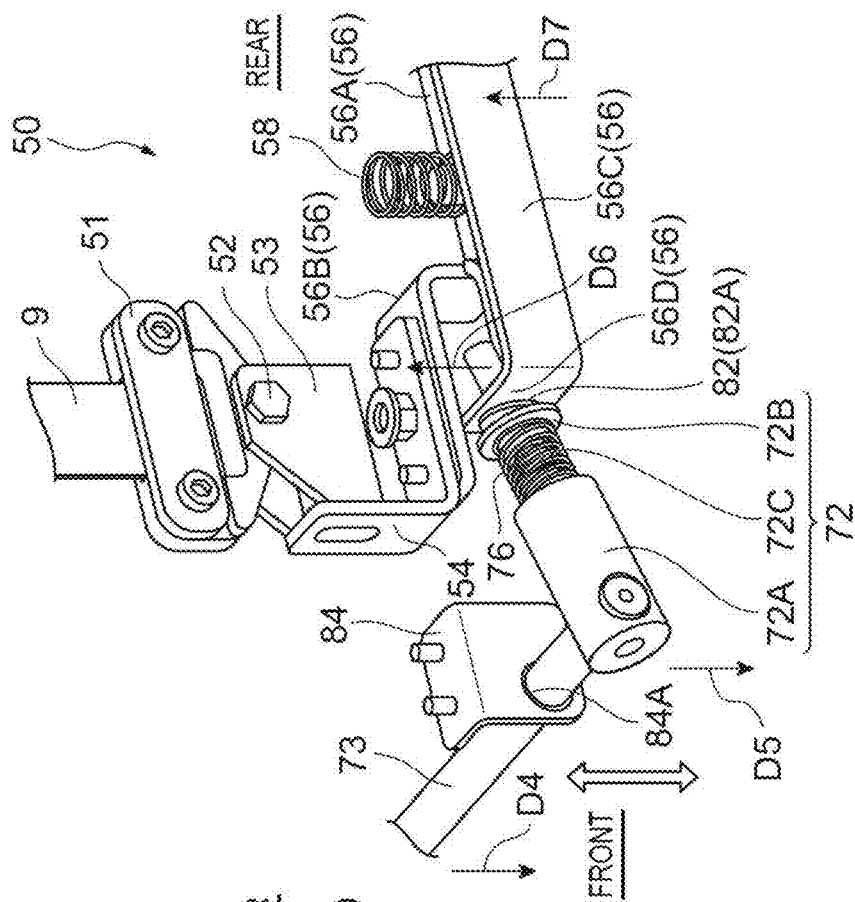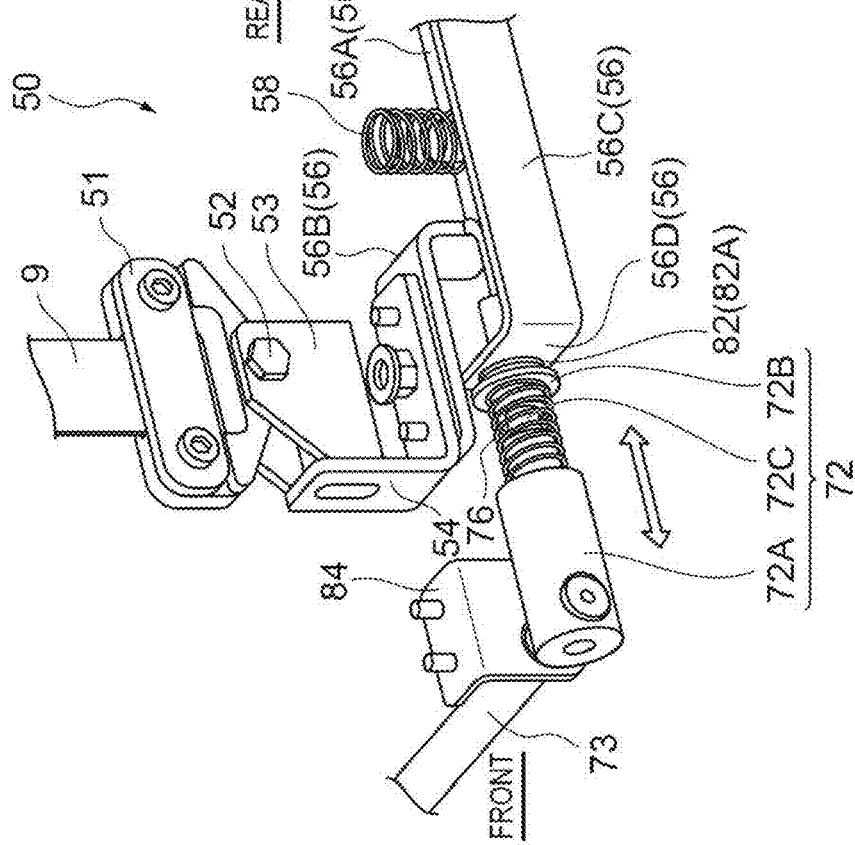

OVERHEAD TRANSPORT VEHICLE

BACKGROUND OF THE INVENTION

1. Field of the Invention

One aspect of the present invention relates to an overhead transport vehicle.

2. Description of the Related Art

A known overhead transport vehicle includes a body unit capable of traveling along a track, and a lifting unit including a gripping part configured to grip an article and configured to ascend and descend with respect to the body unit by winding and paying out a plurality of suspending members. For example, International Publication No. WO 2018/079146 discloses an overhead transport vehicle in which a lifting unit includes a base part to which a gripping part is provided, and a plurality of buffering mechanisms, each including a supporting part configured to support the base part so as to be vertically movable from below in the vertical direction with a buffer part interposed therebetween, and to each of which a suspending member is attached, and these buffering mechanisms are connected by a link mechanism. In this overhead transport vehicle, the link mechanism operates to bring, closer to each other, the distances between the base part and the supporting parts in the buffering mechanisms connected to each other. Thus, it is possible to reduce or prevent swaying of the article while reducing vibrations transmitted to the article.

SUMMARY OF THE INVENTION

Although the conventional overhead transport vehicle described above can reduce or prevent swaying of the article while reducing vibrations transmitted to the article, further reduction of vibrations is required with an increase in variety of articles to be transported.

Preferred embodiments of the present invention provide overhead transport vehicles that each reduce or prevent swaying of an article while further reducing vibrations transmitted to the article.

An overhead transport vehicle according to an aspect of a preferred embodiment of the present invention includes a body capable of traveling along a track, and a lifter including a gripper to grip an article and be raised and lowered with respect to the body by a suspender. The lifter includes a base to which the gripper is provided, a first support including a first buffer to support the base so as to be vertically movable from below in a vertical direction, the first support being connected to the suspender on one side of the body in a width direction perpendicular or substantially perpendicular to a traveling direction of the body in plan view when viewed from the vertical direction, a second support including a second buffer to support the base so as to be vertically movable from below in the vertical direction, the second support being connected to the suspender on the other side of the body in the width direction, and a link connecting the first support and the second support and operable to bring, closer to each other, a first distance between the first support and the base in the vertical direction and a second distance between the second support and the base in the vertical direction. The link includes at least one of a third buffer to allow relative movement of the base in the traveling direction with respect to the first support and the second support and a fourth buffer to allow relative movement of the base in the width direction with respect to the first support and the second support.

In the overhead transport vehicle with this configuration, the link operable to bring, closer to each other, the first distance between the first support and the base in the vertical direction and the second distance between the second support and the base in the vertical direction, is provided. Thus, the tilt of the lifter in the right-and-left direction is reduced, such that swaying of the article can be reduced or prevented. The first support and the second support are provided with the buffers (the first buffer and the second buffer) that allow the base to move in the vertical direction with respect to the first support and the second support. Thus, vertical vibrations transmitted to the article via the lifter can be reduced. Furthermore, the link is provided with the buffer (at least one of the third buffer and the fourth buffer) that allows the base to move in a horizontal direction with respect to the first support and the second support. Thus, horizontal vibrations transmitted to the article via the lifter can be reduced. Consequently, it is possible to reduce or prevent swaying of the article while further reducing vibrations transmitted to the article.

In an overhead transport vehicle according to an aspect of a preferred embodiment of the present invention, the link may include the third buffer. This configuration can reduce front-and-rear vibrations transmitted to the article through the lifter.

In an overhead transport vehicle according to an aspect of the present invention, the link may include both the third buffer and the fourth buffer. This configuration can reduce both front-and-rear vibrations and right-and-left vibrations transmitted to the article through the lifter.

In an overhead transport vehicle according to an aspect of a preferred embodiment of the present invention, the third buffer or the fourth buffer may include an elastic body. Horizontal vibrations transmitted to the article via the lifter can be reduced. This configuration can reduce vibrations efficiently with a simple structure.

According to preferred embodiments of the present invention, it is possible to reduce or prevent swaying of articles while further reducing vibrations transmitted to the articles.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A and 6B are perspective views illustrating a portion of a first supporting part and the link mechanism in an enlarged manner.

DETAILED DESCRIPTION OF THE PREFERRED EMBODIMENTS

Preferred embodiments will now be described in detail with reference to the drawings. In description of the drawings, like elements are designated by like reference signs, and duplicate description is omitted.

Figure 1:
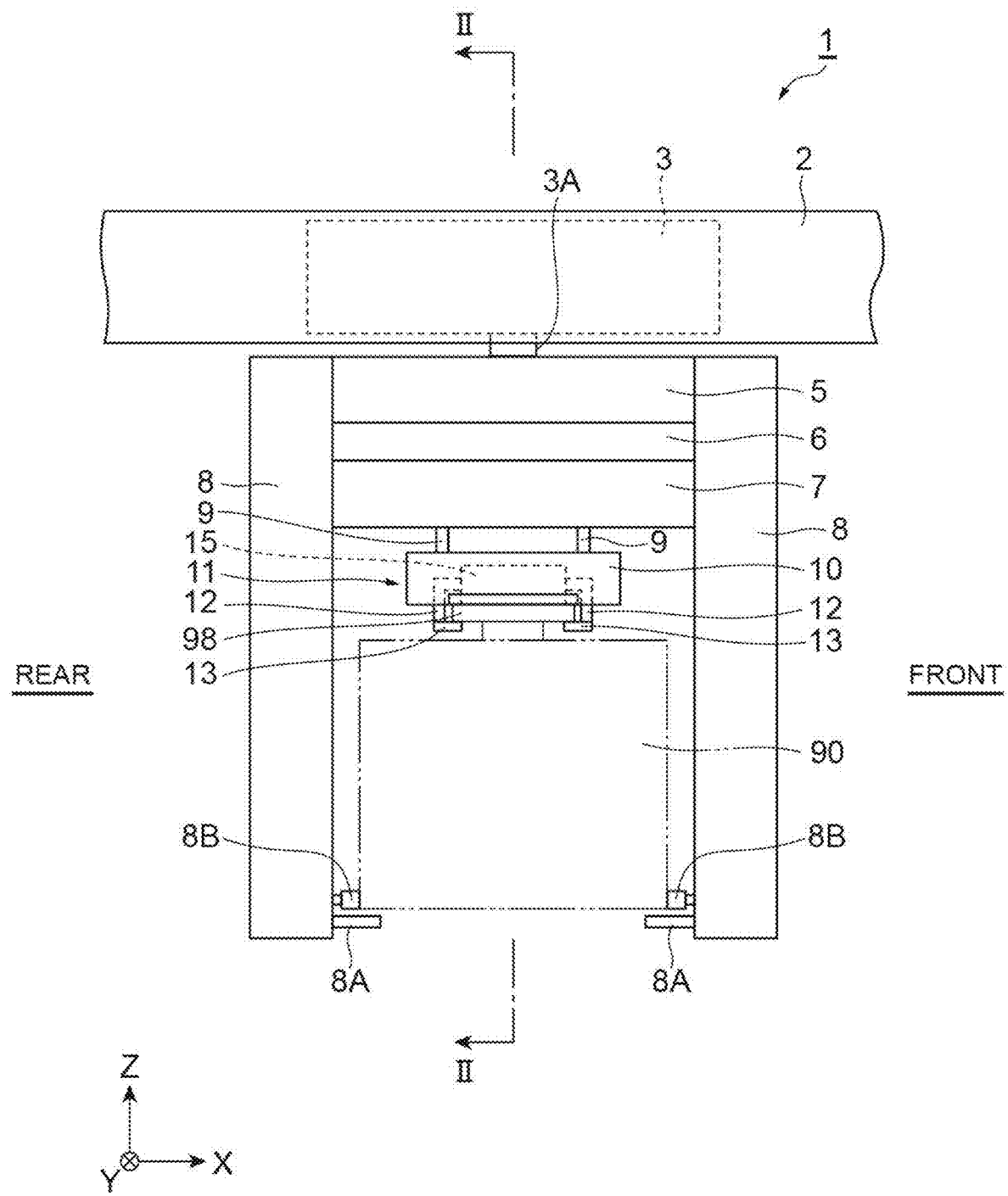
FIG. 1 is a front view illustrating an overhead transport vehicle according to a preferred embodiment of the present invention.
Figure 2:
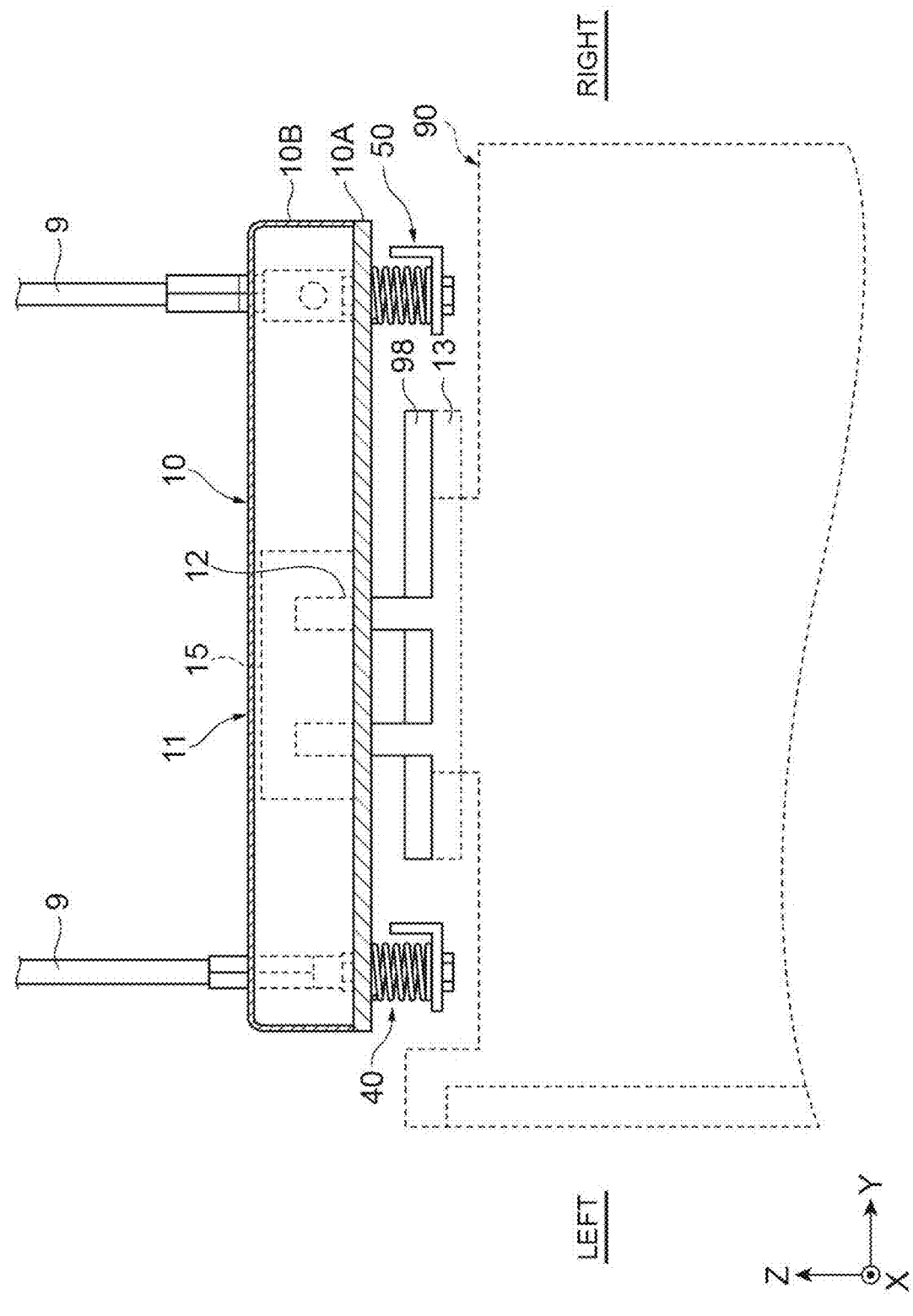
FIG. 2 is a side view of a lifting device when viewed from front.

FIG. 1 is a front view of an overhead transport vehicle according to the present preferred embodiment, and FIG. 2 is a side view of a lifting device when viewed from front. In FIG. 1 and FIG. 2, illustration of a link mechanism 70 (see FIG. 3) is omitted. An overhead transport vehicle 1 illustrated in FIG. 1 travels along a traveling rail (track) 2 installed at a location higher than a floor, such as on a ceiling of a clean room. The overhead transport vehicle 1 transports a front opening unified pod (FOUP) 90 as an article between a storage facility and a predetermined load port, for example. The FOUP 90 accommodates a plurality of semiconductor wafers, for example. The FOUP 90 has a flange 98 to be held by the overhead transport vehicle 1.

In the following description, for convenience of explanation, the right-and-left direction (X-axis direction) in FIG. 1 is defined as the traveling direction of the overhead transport vehicle 1 (hereinafter, also referred to as "front-and-rear direction"). The up-and-down direction (Z-axis direction) in FIG. 1 is defined as the up-and-down direction of the overhead transport vehicle 1 (hereinafter, also referred to as "vertical direction"). The direction into the page of FIG. 1 (Y-axis direction) is defined as the width direction of the overhead transport vehicle 1 (hereinafter, also referred to as "right-and-left direction"). The X-axis, the Y-axis, and the Z-axis are perpendicular or substantially perpendicular to each other.

Figure 3:
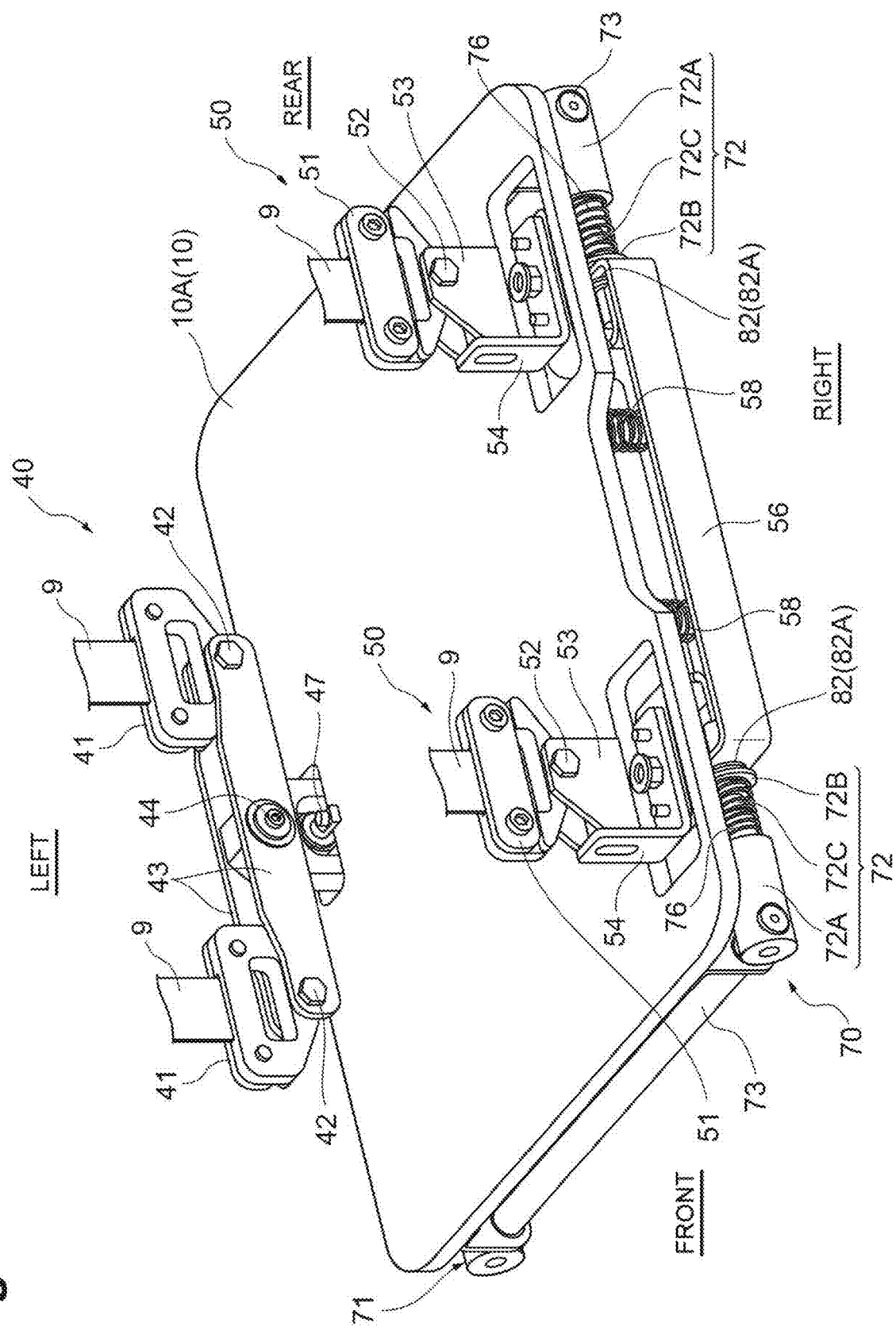
FIG. 3 is a perspective view of the lifting device when viewed from obliquely above.
Figure 4:
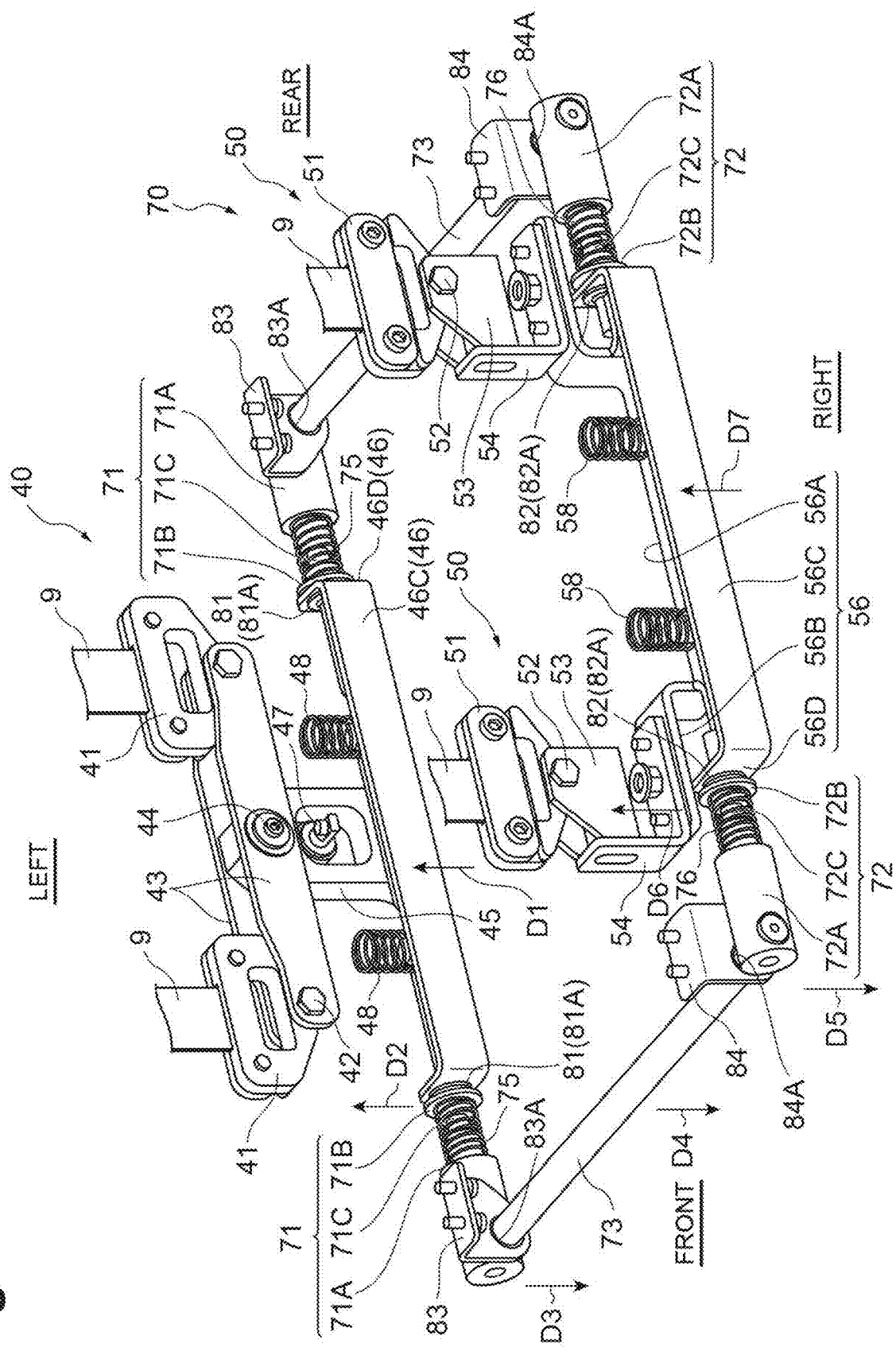
FIG. 4 is a perspective view of the lifting device in a state in which the base part has been removed, when viewed from obliquely above.

As illustrated in FIG. 1, the overhead transport vehicle 1 includes a traveling drive unit 3, a horizontal drive unit (body unit) 5, a rotary drive unit (body unit) 6, a lifting drive unit (body unit) 7, a lifting device (lifting unit) 10, a holding device (gripping part) 11, a first supporting part 50 (see FIG. 3 and FIG. 4), a second supporting part 40 (see FIG. 3 and FIG. 4), and a link mechanism 70 (see FIG. 3 and FIG. 4).

To the overhead transport vehicle 1, a pair of covers 8, 8 are provided on its front and rear sides so as to cover the horizontal drive unit 5, the rotary drive unit 6, the lifting drive unit 7, the lifting device 10, and the holding device 11. The pair of covers 8, 8 define a space to accommodate a FOUP 90 below the holding device 11 in a state in which the lifting device 10 has ascended to its ascending end. Fall-preventing mechanisms 8A prevent a FOUP 90 held by the holding device 11 from falling in the state in which the lifting device 10 has ascended to its ascending end. Swaying suppression mechanisms 8B suppress swaying of the FOUP 90 held by the holding device 11 in the front-and-rear direction (traveling direction) and the right-and-left direction of the overhead transport vehicle 1 during traveling.

The traveling drive unit 3 moves the overhead transport vehicle 1 along the traveling rail 2. The traveling drive unit 3 is disposed inside the traveling rail 2. The traveling drive unit 3 drives a roller (not illustrated) configured to travel on the traveling rail 2. Below the traveling drive unit 3, the horizontal drive unit 5 is provided with a shaft 3A interposed therebetween. The horizontal drive unit 5 moves the rotary drive unit 6, the lifting drive unit 7, and the lifting device 10 in a direction perpendicular or substantially perpendicular to the extending direction of the traveling rail 2 (right-and-left direction) in a horizontal plane. The rotary drive unit 6 rotates the lifting drive unit 7 and the lifting device 10 in a horizontal plane. The lifting drive unit 7 raises and lowers the lifting device 10 by winding and paying out four belts (lifting members) 9. As the belts 9 in the lifting drive unit 7, appropriate suspending members such as wires and ropes may be used.

As illustrated in FIG. 1 and FIG. 2, the lifting device 10 in the present preferred embodiment is provided to be able to be raised and lowered by the lifting drive unit 7, and functions as a lifting platform in the overhead transport vehicle 1. The lifting device 10 includes the holding device 11 configured to grip a FOUP 90, and is raised and lowered by the belts 9 with respect to the horizontal drive unit 5, the rotary drive unit 6, and the lifting drive unit 7 as the body unit. The holding device 11 holds a FOUP 90. The holding device 11 includes a pair of L-shaped arms 12, 12, hands 13, 13 fixed to the respective arms 12, 12, and an opening/closing mechanism 15 configured to open and close the pair of arms 12, 12.

The pair of arms 12, 12 are provided to the opening/closing mechanism 15. The opening/closing mechanism 15 moves the pair of arms 12, 12 in a direction coming closer to each other and in a direction separating apart from each other. By operation of the opening/closing mechanism 15, the pair of arms 12, 12 are moved forward and backward. By this operation, the pair of hands 13, 13 fixed to the arms 12, 12 are opened and closed. In the present preferred embodiment, the height position of the holding device 11 (the lifting device 10) is adjusted such that the holding surface of each hand 13 is positioned lower than the height of the lower surface of the flange 98 when the pair of hands 13, 13 are in an open state. In this state, when the pair of hands 13, 13 are brought into a closed state, the holding surfaces of the hands 13, 13 are moved forward below the lower surface of the flange 98, and the lifting device 10 is raised in this state, so that the flange 98 is held (gripped) by the pair of hands 13, 13, and the FOUP 90 is supported.

The lifting device 10 includes a base part 10A to which the holding device 11 is provided, a cover part 10B covering the base part 10A, a first supporting part 50, and a second supporting part 40. As illustrated in FIG. 3 and FIG. 4, the first supporting part 50 and the second supporting part 40 are mechanisms connecting the belts 9 to the lifting device 10, and also are mechanisms configured to prevent vibrations from being transmitted to the FOUP 90, the vibrations caused when the traveling drive unit 3 travels or the lifting device 10 is raised or lowered.

The first supporting part 50 includes an elastic member (first buffer part) 58 configured to support the base part 10A so as to be vertically movable from below in the vertical direction, and is disposed on one side in the width direction perpendicular or substantially perpendicular to the traveling direction of the overhead transport vehicle 1 in plan view when viewed from the vertical direction. In the present preferred embodiment, the first supporting part 50 is provided on the right side of the lifting device 10 in the right-and-left direction. The first supporting part 50 includes connecting members 51, swing members 53, first body members 54, a second body member 56, and a pair of the elastic members 58, 58.

Each connecting member 51 is a member attached to the corresponding belt 9. Each swing member 53 is a member connected to the corresponding connecting member 51. The swing member 53 is connected to the connecting member 51 so as to be rotatable in both directions via a pin member 52. Each first body member 54 is an L-shaped or substantially L-shaped member, and a bottom part thereof is flat. A portion of the first body member 54 is connected to the corresponding swing member 53. The bottom part of the first body member 54 is connected to the corresponding one of connection parts 56B of the second body member 56 by a bolt, for example.

As illustrated in FIG. 3, FIG. 4, FIG. 6A, and FIG. 6B, the second body member 56 has a body part 56A, the connection parts 56B, a first side part 56C, and second side parts 56D. The body part 56A is a plate-shaped member configured to support the elastic members 58 from below. One end of each connection part 56B is connected to the bottom part of the corresponding first body member 54, and the other end thereof is connected to the body part 56A and the first side part 56C. The first side part 56C extends upright from the body part 56A. The second side parts 56D extend upright from the body part 56A, and are perpendicular or substantially perpendicular to the first side part 56C. The first side part 56C and the second side parts 56D are formed by bending from the body part 56A.

The pair of elastic members 58, 58 are coil springs each having a predetermined spring constant. The pair of elastic members 58, 58 are supported by the body part 56A and also support the base part 10A from below. The lower end of each elastic member 58 is fixed to the body part 56A. The upper end of the elastic member 58 is not fixed to the base part 10A, but supports the base part 10A by being in contact therewith. Specifically, each of the pair of elastic members 58, 58, when being compressed while being in contact with both the body part 56A and the base part 10A, biases the body part 56A and the base part 10A away from each other. Each elastic member 58 has a role of reducing vibrations transmitted between members being in contact with each other. It may be fixed to the base part 10A and be provided in a manner detachable from the body part 56A.

The second supporting part 40 includes an elastic member (second buffer part) 48 configured to support the base part 10A so as to be vertically movable from below in the vertical direction, and is disposed on the other side in the width direction (opposite to the first supporting part 50 in the width direction) perpendicular or substantially perpendicular to the traveling direction of the overhead transport vehicle 1 in plan view when viewed from the vertical direction. In the present preferred embodiment, the second supporting part 40 is provided on the left side of the lifting device 10 in the right-and-left direction. The second supporting part 40 includes connecting members 41, 41, a swing member 43, a third body member 45, a fourth body member 46, a restriction member 47, and a pair of the elastic members 48, 48.

The connecting members 41, 41 are members to which the corresponding belts 9, 9 are attached. The swing member 43 is a member connecting the pair of connecting members 41, 41 to the third body member 45. A pair of the connecting members 41, 41 and the swing member 43 are connected so as to be rotatable in both directions, and are connected together via a pair of pin members 42, 42. The swing member 43 and the third body member 45 are connected so as to be rotatable in both directions, and are connected together via a pin member 44.

Figure 5A:
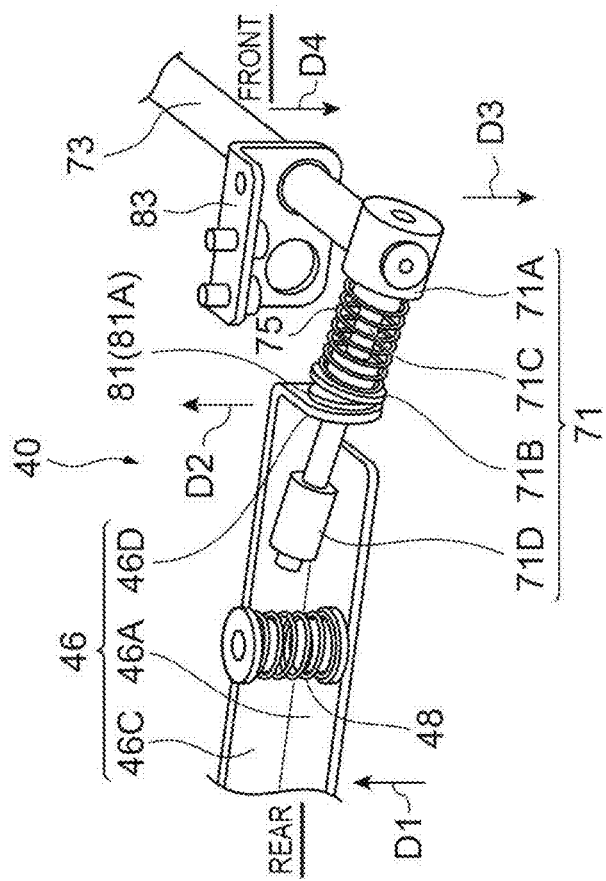
FIG. 5A and FIG. 5B are perspective views illustrating a portion of a second supporting part and a link mechanism in an enlarged manner.
Figure 5B:
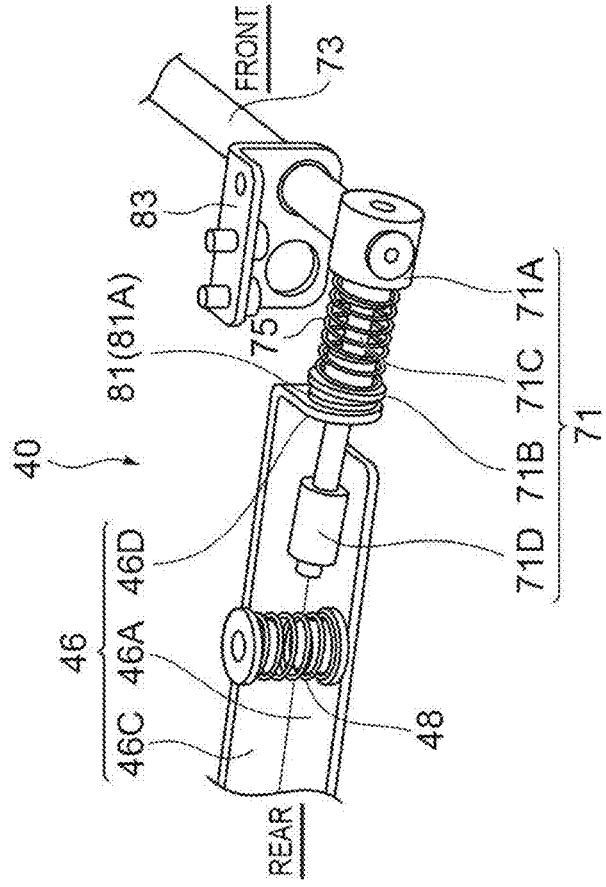
Figure 7:
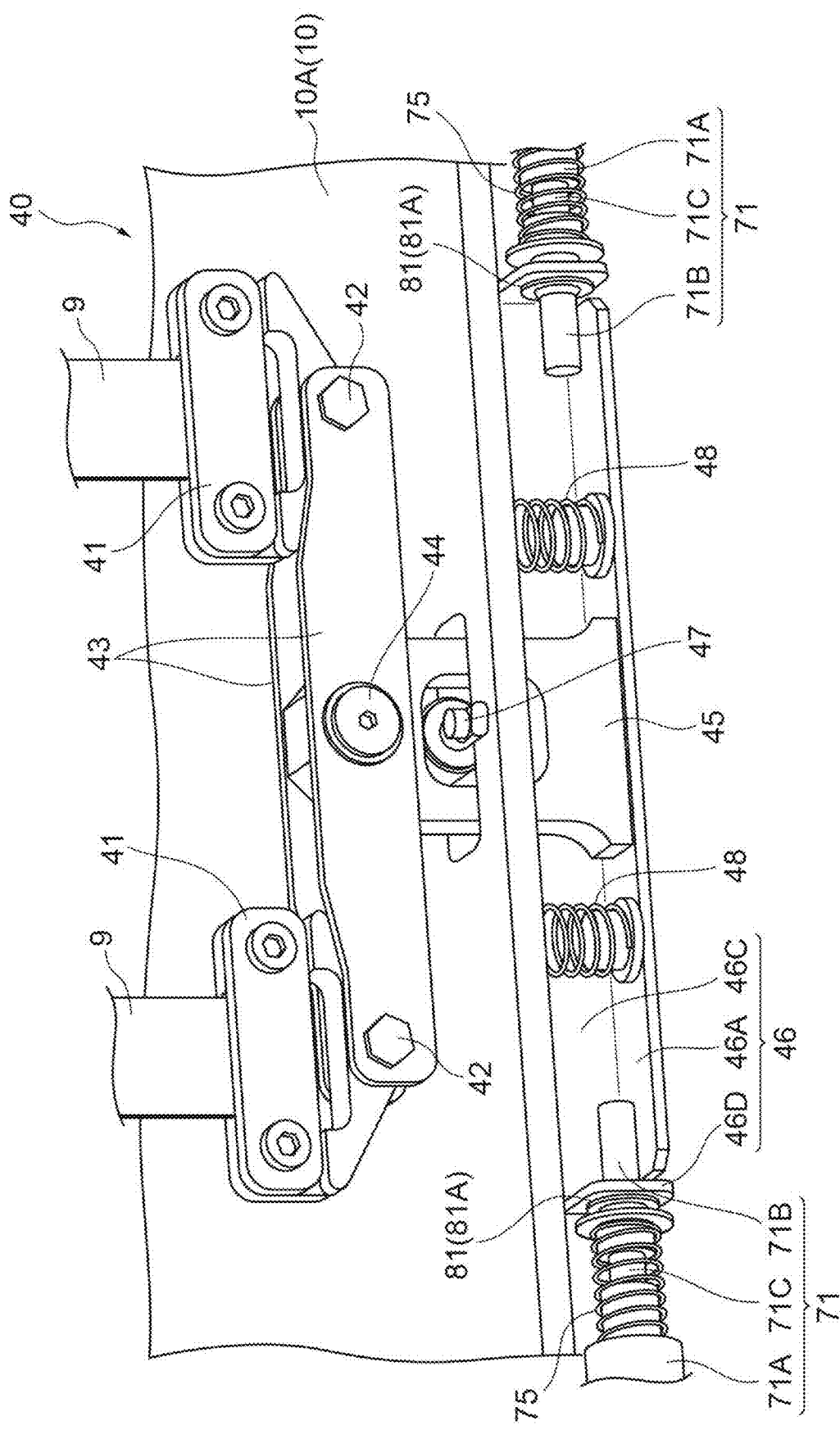
FIG. 7 is a perspective view illustrating a portion of the second supporting part and the link mechanism in an enlarged manner.

As illustrated in FIGS. 5A and 5B, and FIG. 7, the fourth body member 46 includes a body part 46A, a first side part 46C, and second side parts 46D. The body part 46A supports the elastic members 48, 48 from below. The body part 46A is a plate-shaped member to support the elastic members 48, 48 from below. The first side part 46C extends upright from the body part 46A. The second side parts 46D extend upright from the body part 46A, and are perpendicular or substantially perpendicular to the first side part 46C. The first side part 46C and the second side parts 46D are formed by bending from the body part 46A.

The pair of elastic members 48, 48 are coil springs each having a predetermined spring constant. The pair of elastic members 48, 48 are supported by the body part 46A and also support the base part 10A from below. The lower end of each elastic member 48 is fixed to the body part 46A. The restriction member 47 (see FIG. 7) prevents the base part 10A from separating from the body part 46A by a predetermined distance or more. More specifically, the restriction member 47 locks the upper surface of the base part 10A that is prone to separate from the body part 46A by more than a predetermined distance. The upper end of the elastic member 48 is not fixed to the base part 10A, but supports the base part 10A by being in contact therewith. Specifically, each of the pair of elastic members 48, 48, when being in contact with both the body part 46A and the base part 10A, biases the body part 46A and the base part 10A away from each other. Each elastic member 48 has a role of reducing vibrations transmitted between members being in contact with each other. The elastic member 48 may be fixed to the base part 10A and be provided in a manner detachable from the body part 46A.

As illustrated in FIG. 4, the link mechanism 70 connects together the first supporting part 50 and the second supporting part 40, and operates to bring, closer to each other, the distance (first distance) between the first supporting part 50 and the base part 10A in the vertical direction and the distance (second distance) between the second supporting part 40 and the base part 10A in the vertical direction. The following describes details of the link mechanism 70.

The link mechanism 70 includes first shafts (third buffer parts) 71, second shafts (third buffer parts) 72, third shafts 73, first bushings 81, second bushings 82, first blocks 83, and second blocks 84.

As illustrated in FIG. 3, FIG. 4, and FIGS. 5A and 5B, the first shafts 71 are supported by the first bushings 81 provided to the second side parts 46D of the fourth body member 46 in the second supporting part 40, and extend in the front-and-rear direction. Each first shaft 71 is disposed through a through hole 81A of the corresponding first bushing 81, and is provided so as to be rotatable with respect to the first bushing 81 and slidable in the axial direction. The material of the first bushing 81 is appropriately selected such that a shaft part 71C of the first shaft 71 has a predetermined rotatability and a predetermined slidability. The first shafts 71, 71 are disposed at both ends of the second supporting part 40 in the front-and-rear direction. The two first shafts 71, 71 arranged in the front-and-rear direction are disposed substantially in a straight line in the front-and-rear direction.

Each first shaft 71 includes a first body part 71A, a second body part 71B, and the corresponding shaft part 71C. The first body part 71A is connected to one end of the corresponding third shaft 73, and is formed integrally with the shaft part 71C. The diameter of the first body part 71A is larger than the diameter of the shaft part 71C. The second body part 71B is formed so as to be capable of being fitted onto the shaft part 71C and movable with respect to the shaft part 71C. The diameter of the second body part 71B is larger than the diameter of the shaft part 71C. An elastic member (third buffer part) 75 is fitted onto the shaft part 71C and is also disposed between the first body part 71A and the second body part 71B. The elastic member 75 is a coil spring having a predetermined spring constant, and biases the second body part 71B against the corresponding second side part 46D of the fourth body member 46. One end of the shaft part 71C is provided with a stopper 71D configured to prevent the first shaft 71 from tilting. This stopper 71D is formed of a material that allows sliding in the front-and-rear direction with respect to the body part 46A of the fourth body member 46.

The first shafts 71 thus configured allow the second supporting part 40 to relatively move in the front-and-rear direction (traveling direction) from a fixed position with respect to the base part 10A. As illustrated in FIG. 4, a pair of the elastic members 75, 75 provided with the second supporting part 40 interposed therebetween in the front-and-rear direction have a function of returning the second supporting part 40, which moves in the front-and-rear direction (traveling direction) from the fixed position with respect to the base part 10A, to the fixed position. For example, when the second supporting part 40 has relatively moved forward in the front-and-rear direction from the fixed position with respect to the base part 10A, the elastic member provided to the first shaft 71 disposed on the front side in the front-and-rear direction is compressed. The second supporting part 40 is returned to the fixed position with respect to the base part 10A by a repulsive force provided by the elastic member 75. For example, when the second supporting part 40 has relatively moved rearward in the front-and-rear direction from the fixed position with respect to the base part 10A, the elastic member 75 provided to the first shaft 71 disposed on the rear side in the front-and-rear direction is compressed. The second supporting part is returned to the fixed position with respect to the base part by repulsive force of this elastic member 75.

As illustrated in FIG. 3, FIG. 4, FIG. 6A, and FIG. 6B, the second shafts 72 are supported by the second bushings 82 provided to the second side parts 56D of the second body member 56 in the first supporting part 50, and extend in the front-and-rear direction. Each second shaft 72 is disposed through the through hole 82A of the corresponding second bushing 82, and is provided so as to be rotatable with respect to the second bushing 82 and slidable in the axial direction. The material of the second bushing 82 is appropriately selected such that a shaft part 72C of the second shaft 72 has a predetermined rotatability and a predetermined slidability. The second shafts 72, 72 are disposed at both ends of the first supporting part 50 in the front-and-rear direction. The two second shafts 72, 72 arranged in the front-and-rear direction are disposed substantially in a straight line in the front-and-rear direction.

Each second shaft 72 includes a first body part 72A, a second body part 72B, and the corresponding shaft part 72C. The first body part 72A is connected to the other end of the third shaft 73, and is formed integrally with the shaft part 72C. The diameter of the first body part 72A is larger than the diameter of the shaft part 72C. The second body part 72B is formed so as to be capable of being fitted onto the shaft part 72C and movable with respect to the shaft part 72C. The diameter of the second body part 72B is larger than the diameter of the shaft part 72C. An elastic member (third buffer part) 76 is fitted onto the shaft part 72C and is also disposed between the first body part 72A and the second body part 72B. The elastic member 76 is a coil spring having a predetermined spring constant and biases the second body part 72B against the corresponding second side part 56D of the second body member 56.

The second shafts 72 thus configured allow the first supporting part 50 to relatively move in the front-and-rear direction (traveling direction) from a fixed position with respect to the base part 10A. As illustrated in FIG. 4, a pair of the elastic members 76, 76 provided with the first supporting part 50 interposed therebetween in the front-and-rear direction have a function of returning the second supporting part 40, which moves in the front-and-rear direction (traveling direction) from the fixed position with respect to the base part 10A, to the fixed position. For example, when the first supporting part 50 has relatively moved forward in the front-and-rear direction from the fixed position with respect to the base part 10A, the elastic member 76 provided to the second shaft 72 disposed on the front side in the front-and-rear direction is compressed. The first supporting part 50 is returned to the fixed position with respect to the base part 10A by repulsive force of this elastic member 76. For example, when the first supporting part 50 has relatively moved rearward in the front-and-rear direction from the fixed position with respect to the base part 10A, the elastic member 76 provided to the second shaft 72 disposed on the rear side in the front-and-rear direction is compressed. The first supporting part 50 is returned to the fixed position with respect to the base part 10A by repulsive force of this elastic member 76.

As illustrated in FIG. 3, FIG. 4, FIGS. 5A and 5B, and FIGS. 6A and 6B, the third shafts 73 are supported by the first blocks 83 and the second blocks 84 fixed to the bottom surface of the base part 10A, and extend in the right-and-left direction. The third shafts 73 are each disposed in the front-and-rear direction, and the two third shafts 73, 73 are parallel or substantially parallel to each other. Each third shaft 73 is disposed through a through hole 83A of the corresponding first block 83 and a through hole 84A of the corresponding second block 84, and is provided so as to be rotatable with respect to the first block 83 and the second block 84 and slidable in the axial direction.

One end of the third shaft 73 in the right-and-left direction is connected to the corresponding first shaft 71, and the other end of the third shaft 73 is connected to the corresponding second shaft 72. Specifically, the one end of the third shaft 73 is connected by being inserted into a through hole formed in the first shaft 71, and the other end of the third shaft 73 is connected by being inserted into a through hole formed in the second shaft 72.

The following describes an example of operation of the first supporting part 50, mainly using FIG. 3, FIG. 4, FIGS. 5A and 5B, and FIGS. 6A and 6B. When a FOUP 90 containing an object to be accommodated or an empty FOUP 90 is gripped by the holding device 11, load is applied to the elastic members 58, and the elastic members 58 are compressed. When the elastic members 58 have been compressed, repulsive force is generated and the base part 10A is biased. Vibrations transmitted to the FOUP 90 via the holding device 11 when the traveling drive unit 3 travels or when the lifting device 10 ascends or descends are reduced by the elastic members 58 provided to the first supporting part 50.

The following describes an example of operation of the second supporting part 40. When a FOUP 90 containing an object to be accommodated or an empty FOUP 90 is gripped by the holding device 11, load is applied to the elastic members 48, and the elastic members 48 are compressed. When the elastic members 48 have been compressed, repulsive force is generated and the base part 10A is biased. Vibrations transmitted to the FOUP 90 via the holding device 11 when the traveling drive unit 3 travels or when the lifting device 10 ascends or descends are reduced by the elastic members 48 provided to the second supporting part 40.

The following describes an example of operation of the link mechanism 70 connecting together the second supporting part and the first supporting part 50 arranged in the right-and-left direction. For example, it is assumed that, due to centrifugal force during traveling, force has been applied to the elastic members 48, 48 of the second supporting part 40 on the left side. When the force has been applied to the elastic members 48, 48 of the second supporting part 40, the elastic members 48, 48 are compressed, and the fourth body member 46 accordingly moves upward (arrow D1). In other words, the distance between the fourth body member 46 and the base part 10A decreases. Upward movement in this operation indicates relative movement closer to the base part 10A, and downward movement indicates relative movement away from the base part 10A. When the fourth body member 46 has moved upward, an end of each first shaft 71, which is fixed to the fourth body member 46 with the corresponding first bushing 81 interposed therebetween, on the first bushing 81 side moves upward (arrow D2), and an end of the first shaft 71 on a side connected to the corresponding third shaft 73 moves downward (arrow D3).

When the end of the first shaft 71 on the third shaft 73 side has moved downward, the third shaft 73 also moves downward (arrow D4). When the third shaft 73 has moved downward, an end of the second shaft 72, which is connected to the third shaft 73 and fixed to the second body member 56 with the corresponding second bushing 82 interposed therebetween, on the third shaft 73 side moves downward (arrow D5), and an end thereof on the second bushing 82 side moves upward (arrow D6). This movement pushes the second body member 56 upward (arrow D7). When the second body member 56 has been pushed up, the elastic members 58, 58 of the first supporting part 50 are compressed, and the distance between the first body member 54 and the base part 10A decreases.

In contrast, when the elastic members 48, 48 have been pulled and the elastic members 48, 48 have been accordingly stretched, the fourth body member 46 moves downward (opposite to the arrow D1). In other words, the distance between the fourth body member 46 and the base part 10A increases. When the fourth body member 46 has moved downward, the end of the first shaft 71, which is fixed to the fourth body member 46 with the first bushing 81 interposed therebetween, on the first bushing 81 side moves downward (opposite to the arrow D2), and the end of the first shaft 71 on the side connected to the third shaft 73 moves upward (opposite to the arrow D3).

When the end of the first shaft 71 on the third shaft 73 side has moved upward, the third shaft 73 also moves upward (opposite to the arrow D4). When the third shaft 73 has moved upward, the end of the second shaft 72, which is connected to the third shaft 73 and fixed to the second body member 56 with the second bushing 82 interposed therebetween, on the third shaft 73 side moves upward (opposite to the arrow D5), and the end thereof on the second bushing 82 side moves downward (opposite to the arrow D6). This movement pushes the second body member 56 downward (opposite to the arrow D7). When the second body member 56 has been pushed down, the elastic members 58, 58 of the first supporting part 50 are stretched, and the distance between the first body member 54 and the base part 10A increases.

As described above, the link mechanism 70 connecting the second supporting part 40 and the first supporting part 50 that are arranged in the right-and-left direction, when the elastic members 48, 48 of the second supporting part 40 and the elastic members 58, 58 of the first supporting part 50 have been compressed or stretched, the third shafts 73 follow this movement and rotate about the first blocks 83 and the second blocks 84 fixed to the bottom surface of the base part 10A, thereby compressing or stretching the elastic members 48, 48 of the second supporting part and the elastic members 58, 58 of the first supporting part 50. In other words, when a difference has occurred between the distance between the base part 10A and the fourth body member 46 and the distance between the base part 10A and the second body member 56 in the second supporting part 40 and the first supporting part 50 that are connected to each other, the link mechanism 70 operates to bring, closer to each other, the distance between the base part and the fourth body member 46 and the distance between the base part 10A and the second body member 56 in the second supporting part 40 and the first supporting part 50 that are connected to each other.

The link mechanism 70 includes the third shafts 73 configured to generate stress (torsional stress) when a difference has occurred between the distance between the base part 10A and the fourth body member 46 and the distance between the base part 10A and the second body member 56. The reaction force to the stress generated in the third shafts 73 acts as a force that reduces each of the distance between the base part 10A and the fourth body member 46 and the distance between the base part 10A and the second body member 56.

The following describes functional effects of the overhead transport vehicle 1 according to the present preferred embodiment described above. In the overhead transport vehicle 1 according to the above preferred embodiment, the link mechanism 70 configured to operate to bring, closer to each other, the distance between the first supporting part 50 and the base part 10A in the vertical direction and the distance between the second supporting part 40 and the base part 10A in the vertical direction is provided. Thus, occurrence of rolling motion in the lifting device 10 (base part 10A) can be reduced or prevented. Thus, the tilt of the base part 10A in the right-and-left direction can be reduced, whereby swaying of the FOUP 90 can be reduced or prevented.

The first supporting part 50 and the second supporting part 40 are provided with the elastic members 48, 58 that allow the base part 10A to move in the vertical direction with respect to the first supporting part 50 and the second supporting part 40. Thus, vertical vibrations transmitted to the FOUP 90 via the lifting device 10 can be reduced. Furthermore, the link mechanism 70 allows the base part 10A to move in the horizontal direction with respect to the first supporting part 50, causes force for returning it to the fixed (neutral) position to be always exerted by the elastic members 76, 76, allows the base part 10A to move in the horizontal direction with respect to the second supporting part 40, and also causes force for returning it to the fixed position to be always exerted by the elastic members 75, 75. Thus, horizontal vibrations transmitted to the FOUP 90 via the lifting device 10, more specifically, front-and-rear vibrations can be reduced. Consequently, it is possible to reduce or prevent swaying of the FOUP 90 while further reducing vibrations transmitted to the FOUP 90.

In the overhead transport vehicle 1 according to the above preferred embodiment, the elastic members 48, 58, 75, 76 are formed by spring members, and thus vibrations can be reduced efficiently with a simple configuration.

Although preferred embodiments have been described above, the aspects of preferred embodiments of the present invention are not limited to the preferred embodiments described above, and various modifications may be made within the scope not departing from the gist of the present invention.

In the overhead transport vehicle 1 according to the above preferred embodiment, an example has been described in which the first supporting part 50 is allowed to relatively move in the traveling direction with respect to the base part 10A, force for returning the first supporting part 50 to the fixed position is always exerted by the elastic members 76, 76, and the second supporting part 40 is allowed to relatively move in the traveling direction with respect to the base part 10A, and also force for returning the second supporting part 40 to the fixed position is always exerted by the elastic members 75, 75. In addition to this configuration, a configuration may also be provided in which the first supporting part 50 and the second supporting part 40 are allowed to relatively move in the right-and-left direction with respect to the base part 10A and force for returning the first supporting part 50 and the second supporting part 40 to the fixed positions is always exerted by elastic members 77.

Figure 8:
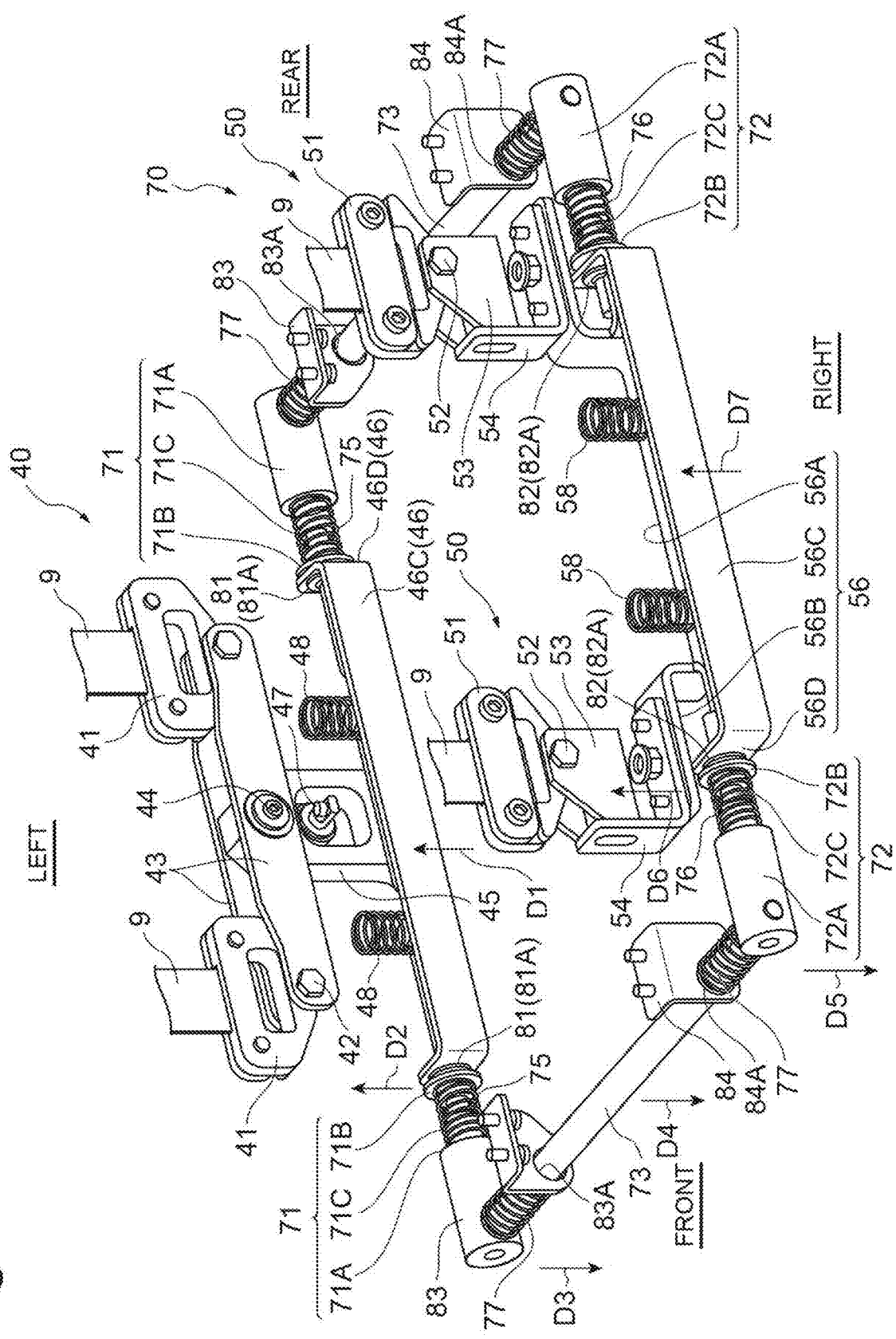
FIG. 8 is a perspective view, when viewed from obliquely above, of a lifting device according to a modification in a state in which the base part has been removed.

Specifically, as illustrated in FIG. 8, in each of the third shafts (fourth buffer parts) 73, an elastic member 77 is disposed between the corresponding first body part 72A and the corresponding second block 84, and an elastic member 77 is disposed between the corresponding first body part 71A and the corresponding first block 83. The third shafts 73 thus configured allow the first supporting part 50 and the second supporting part 40 to relatively move in the right-and-left direction (width direction) from the fixed positions with respect to the base part 10A. The elastic members 77, 77 disposed at both ends of each third shaft 73 in the right-and-left direction have a function of returning the first supporting part 50 and the second supporting part 40, which move in the right-and-left direction (width direction) from the fixed positions with respect to the base part 10A, to the fixed positions.

For example, when the first supporting part 50 or the second supporting part 40 has relatively moved rightward in the right-and-left direction from the fixed position with respect to the base part 10A, the elastic members 77 disposed on the right side in the right-and-left direction are compressed. The first supporting part 50 or the second supporting part 40 is returned to the fixed position with respect to the base part 10A by repulsive force of these elastic members 77. For example, when the first supporting part 50 or the second supporting part 40 has relatively moved leftward in the right-and-left direction from the fixed position with respect to the base part 10A, the elastic members 77 disposed on the left side in the right-and-left direction are compressed. The first supporting part 50 or the second supporting part 40 is returned to the fixed position with respect to the base part 10A by repulsive force of these elastic members 77. The overhead transport vehicle 1 configured according to this modification can reduce both front-and-rear and right-and-left vibrations transmitted to the FOUP 90 via the lifting device 10.

To the base part 10A of the overhead transport vehicle 1 according to the above preferred embodiment, instead of the configuration including the components (the second shafts 72 and the elastic members 76, 76) that allow relative movement of the first supporting part 50 in the traveling direction with respect and the components (the first shafts 71 and the elastic members 75, 75) that allow relative movement of the second supporting part 40 in the traveling direction, the configuration including the components (the elastic members 77) in the above modification may be provided. The overhead transport vehicle 1 configured according to this modification can reduce right-and-left vibrations transmitted to the FOUP 90 via the lifting device 10.

In the preferred embodiments and the modifications above, examples have been described in which coil springs are used as examples of the elastic members 48, 58, 75, 76, 77. However, for example, gel elastic bodies formed of silicone resin or the like may be disposed instead. Even in this case, vibrations and shock can be absorbed similarly to the case with the coil springs.

In the preferred embodiments and the modifications above, examples have been described in which the first supporting part 50 is provided on the right side of the lifting device 10 in the right-and-left direction and the second supporting part 40 is provided on the left side of the lifting device 10 in the right-and-left direction. However, the present invention is not limited to this. For example, the overhead transport vehicle 1 may have a configuration in which the positions of the first supporting part 50 and the second supporting part 40 are exchanged in the right-and-left direction. Herein, for example, the configurations of supporting parts connecting the belts 9 to the base part 10A may be the same as each other, and specifically, for example, first supporting parts 50 or second supporting parts 40 may be disposed on both sides in the right-and-left direction.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport vehicle comprising:
   a body to travel along a track; and
   a lifter including a gripper to grip an article and be raised and lowered with respect to the body by a suspender; wherein
   the lifter includes:
      a base with which the gripper is provided;
      a first support including a first buffer to support the base so as to be vertically movable from below in a vertical direction, the first support being connected to the suspender on one side of the body in a width direction perpendicular or substantially perpendicular to a traveling direction of the body in plan view when viewed from the vertical direction;
      a second support including a second buffer to support the base so as to be vertically movable from below in the vertical direction, the second support being connected to the suspender on the other side of the body in the width direction; and
      a link connecting the first support and the second support and operable to bring, closer to each other, a first distance between the first support and the base in the vertical direction and a second distance between the second support and the base in the vertical direction; and
   the link includes at least one of a third buffer to allow relative movement of the base in the traveling direction with respect to the first support and the second support and a fourth buffer to allow relative movement of the base in the width direction with respect to the first support and the second support.

2. The overhead transport vehicle according to claim 1, wherein the link includes the third buffer.

3. The overhead transport vehicle according to claim 1, wherein the link includes both the third buffer and the fourth buffer.

4. The overhead transport vehicle according to claim 1, wherein the third buffer or the fourth buffer includes an elastic body.

5. The overhead transport vehicle according to claim 2, wherein the link includes both the third buffer and the fourth buffer.

6. The overhead transport vehicle according to claim 2, wherein the third buffer or the fourth buffer includes an elastic body.

7. The overhead transport vehicle according to claim 3, wherein the third buffer or the fourth buffer includes an elastic body.

8. The overhead transport vehicle according to claim 5, wherein the third buffer or the fourth buffer includes an elastic body.

* * * * *